US009651584B2

United States Patent
Gunn

(10) Patent No.: US 9,651,584 B2
(45) Date of Patent: May 16, 2017

(54) ISOLATED AND SELF-CALIBRATING VOLTAGE MEASUREMENT SENSOR

(71) Applicant: SCHNEIDER ELECTRIC USA, INC., Palatine, IL (US)

(72) Inventor: Colin Gunn, Cowichan Bay (CA)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 148 days.

(21) Appl. No.: 14/649,816

(22) PCT Filed: Dec. 5, 2012

(86) PCT No.: PCT/US2012/067842
§ 371 (c)(1),
(2) Date: Jun. 4, 2015

(87) PCT Pub. No.: WO2014/088562
PCT Pub. Date: Jun. 12, 2014

(65) Prior Publication Data
US 2015/0346240 A1    Dec. 3, 2015

(51) Int. Cl.
*G01R 19/00* (2006.01)
*G01R 35/00* (2006.01)
(Continued)

(52) U.S. Cl.
CPC ......... *G01R 19/0046* (2013.01); *G01R 15/06* (2013.01); *G01R 15/16* (2013.01);
(Continued)

(58) Field of Classification Search
None
See application file for complete search history.

(56) References Cited

U.S. PATENT DOCUMENTS

| 4,689,752 A | 8/1987 | Fernandes et al. |
| 5,065,142 A | 11/1991 | Green |

(Continued)

FOREIGN PATENT DOCUMENTS

| JP | 2003028900 A | 1/2003 |
| JP | 2010127725 A | 6/2010 |

OTHER PUBLICATIONS

Extended European Search Report from corresponding European Application No. 12889686.7 dated Jul. 22, 2016.
(Continued)

*Primary Examiner* — Paresh Patel
(74) *Attorney, Agent, or Firm* — Lando & Anastasi, LLP

(57) ABSTRACT

According to one aspect, embodiments described herein provide a sensor comprising a housing configured to be coupled around a portion of the transmission line, at least one probe capacitor configured to encircle the portion of the transmission line with the housing coupled around the portion of the transmission line, a measurement capacitor configured to encircle the portion of the transmission line with the housing coupled around the portion of the transmission line, a capacitance acquisition system, and a voltage measurement system, wherein the capacitance acquisition system is configured to determine a first value related to capacitance of the at least one probe capacitor, and based on the first value, determine a second value related to capacitance of the measurement capacitor, and wherein the voltage measurement system is configured to receive a signal providing the second value and calculate a third value related to a voltage level of the transmission line.

20 Claims, 7 Drawing Sheets

(51) Int. Cl.
*G01R 15/06* (2006.01)
*G01R 15/16* (2006.01)
G01R 15/26 (2006.01)
G01R 27/26 (2006.01)

(52) U.S. Cl.
CPC ....... *G01R 19/0084* (2013.01); *G01R 35/005* (2013.01); *G01R 15/26* (2013.01); *G01R 27/2605* (2013.01)

(56) References Cited

U.S. PATENT DOCUMENTS

| | | |
|---|---|---|
| 5,181,026 A | 1/1993 | Granville |
| 5,661,405 A | 8/1997 | Simon et al. |
| 6,946,851 B2 * | 9/2005 | Lee ........................ B82Y 30/00 324/658 |
| 2002/0171433 A1 | 11/2002 | Watanabe et al. |
| 2003/0128133 A1 | 7/2003 | Thomas et al. |
| 2005/0275397 A1 | 12/2005 | Lightbody et al. |
| 2006/0279910 A1 | 12/2006 | Gunn et al. |
| 2007/0227253 A1 | 10/2007 | Kleven |
| 2008/0122457 A1 | 5/2008 | Taguchi |
| 2012/0306676 A1 | 12/2012 | Balasubramaniam et al. |

OTHER PUBLICATIONS

Nojdelov ret al: "Capacitance to Digital Converter", Proceedings of the 2007 IEEE Sensors Applications Symposium, IEEE—Piscataway, NJ, USA, Feb. 1, 2007 (Feb. 1, 2007), pp. 1-5, XP031180464, DOI: 10.1109/SAS.2007.374409, ISBN: 978-1-4244-0677-7.

International Search Report from corresponding PCT/US2012/067842 dated Mar. 7, 2013.

\* cited by examiner

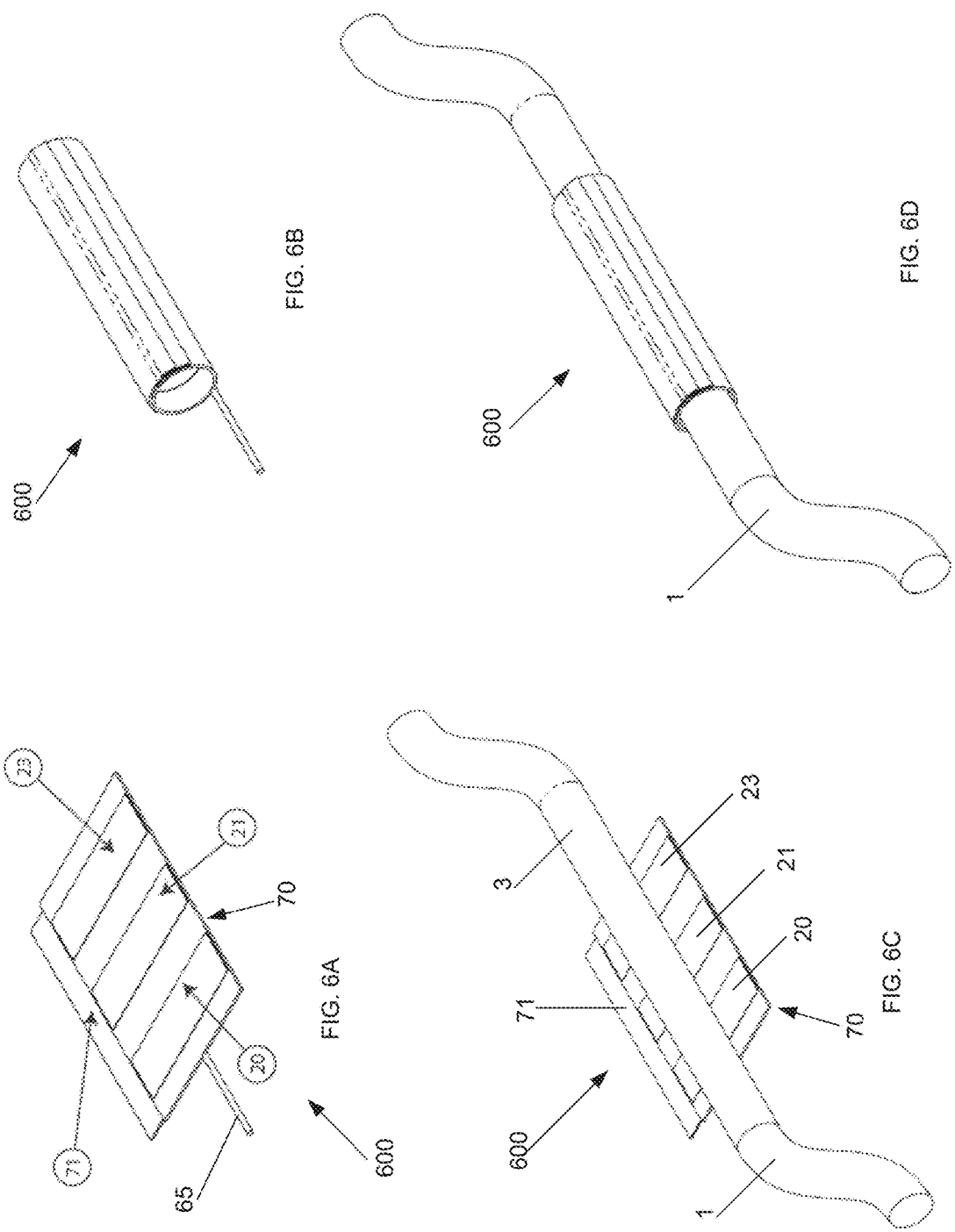

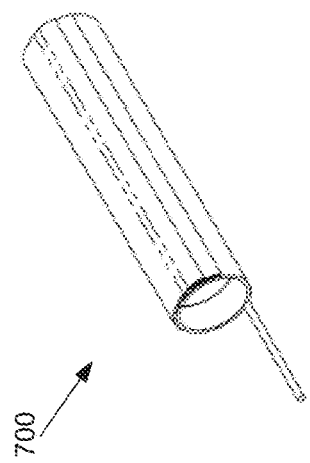
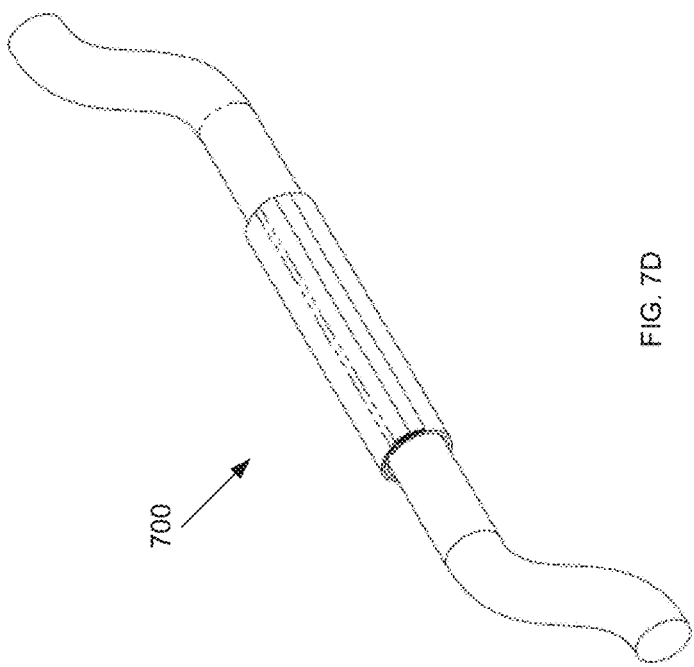
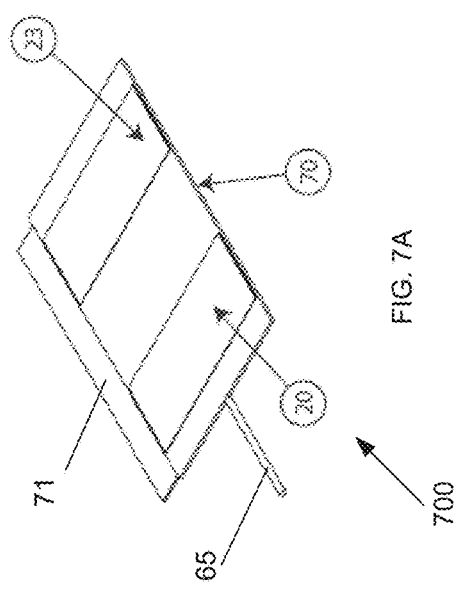
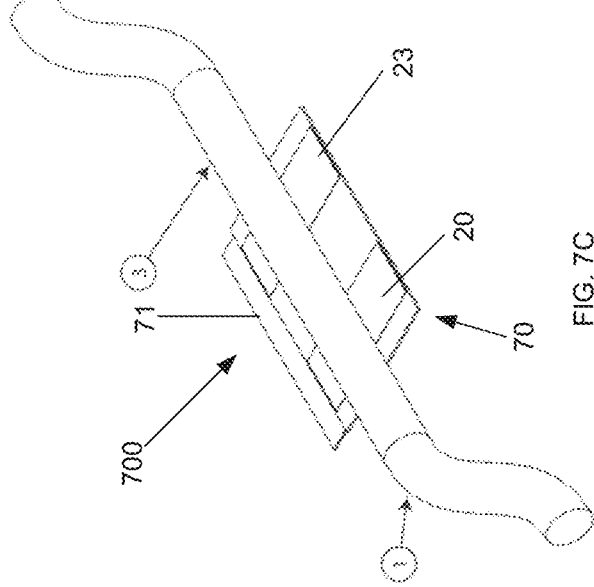

US 9,651,584 B2

ISOLATED AND SELF-CALIBRATING VOLTAGE MEASUREMENT SENSOR

This application is a U.S. National Stage Application under 35 U.S.C. §371 from International Application No. PCT/US2012/067842, filed Dec. 5, 2012, which is hereby incorporated by reference in its entirety for all purposes.

BACKGROUND OF INVENTION

1. Field of Invention

The present invention relates generally to systems and methods for monitoring AC voltage on a conductor. More specifically, the present invention relates to a non-contact and self-calibrating AC voltage sensor.

2. Discussion of Related Art

Typical electric utility power systems include primary distribution systems which include substations that receive power from a main source. The substations include high and medium voltage feeder lines that transmit power from the substations to secondary distribution systems. The secondary distribution systems include branch lines which provide medium or low voltage power to at least one destination (e.g., a large factory machine, or an outlet within a customer's home). It is often necessary to monitor voltage signals on the branch or feeder lines for energy metering, power quality measurement applications. It is also often necessary during periodic maintenance and troubleshooting to make temporary voltage measurements on the branch or feeder lines.

SUMMARY OF INVENTION

At least one aspect of the invention is directed to a sensor for detecting voltage on a transmission line, the sensor comprising a housing configured to be coupled around a portion of the transmission line, at least one probe capacitor coupled to the housing and configured to encircle the portion of the transmission line with the housing coupled around the portion of the transmission line, a measurement capacitor coupled to the housing and configured to encircle the portion of the transmission line with the housing coupled around the portion of the transmission line, a capacitance acquisition system coupled to the at least one probe capacitor, and a voltage measurement system coupled to the measurement capacitor and configured to communicate with the capacitance acquisition system, wherein the capacitance acquisition system is configured to determine a first value related to capacitance of the at least one probe capacitor, and based on the first value, determine a second value related to capacitance of the measurement capacitor, and wherein the voltage measurement system is configured to receive a signal providing the second value from the capacitance acquisition system and calculate a third value related to a voltage level of the transmission line.

According to one embodiment, the voltage measurement system comprises a voltage divider including the measurement capacitor and a reference capacitor coupled to a ground connection, and wherein the voltage measurement system is configured to calculate the third value related to the voltage level of the transmission line using a voltage divider ratio based on the second value and a capacitance of the reference capacitor.

According to another embodiment, the capacitance acquisition system is configured to be isolated from a ground connection of the transmission line. In one embodiment the reference capacitor is a variable reference capacitor and wherein the measurement system further comprises a controller coupled to the voltage divider and to the variable reference capacitor, wherein the controller is configured to define the voltage divider ratio by adjusting the capacitance of the reference capacitor.

According to one embodiment, the capacitance acquisition system includes a capacitance to digital conversion circuit coupled to the at least one probe capacitor and configured to determine the first value. In another embodiment, the capacitance acquisition system includes a data interface coupled between the capacitance to digital conversion circuit and the controller, and wherein the data interface is configured to transmit the second value to the controller. In one embodiment, the capacitance acquisition system includes a first wireless transceiver coupled to the capacitance to digital conversion circuit, wherein the voltage measurement system includes a second wireless transceiver coupled to the controller, and wherein the first wireless transceiver is configured to transmit the signal to the controller via the second wireless transceiver.

According to another embodiment, the at least one probe capacitor includes a first probe capacitor and a second probe capacitor, the first and second probe capacitors configured to be coupled around the transmission line in series, and wherein the capacitance acquisition system is configured to determine the first value based on characteristics of the first and second probe capacitors.

According to one embodiment, the measurement system further comprises a switch configured to selectively couple the capacitance acquisition system to the measurement capacitor in a first mode of operation and to selectively couple the voltage divider to the measurement capacitor in a second mode of operation, wherein the at least one probe capacitor includes a single probe capacitor and the measurement capacitor, the single probe capacitor and the measurement capacitor configured to be coupled around the transmission line in series in the first mode of operation, wherein the capacitance acquisition system is configured to determine the first value based on characteristics of the single probe capacitor and the measurement capacitor in the first mode of operation, and wherein the voltage measurement system is configured to receive the signal providing the second value from the capacitance acquisition system and calculate, in the second mode of operation, the third value related to the voltage level of the transmission line.

According to another embodiment, the capacitance acquisition system includes an isolated power supply configured to provide power to the capacitance acquisition system. In one embodiment, the isolated power supply includes an inductive current clamp transformer configured to be coupled around the transmission line and to provide power to the capacitance acquisition system.

According to one embodiment, the voltage measurement system includes a wireless transceiver configured to transmit the third value related to the voltage level of the transmission line to an external system. In one embodiment, the at least one probe capacitor and the measurement capacitor have substantially the same capacitance. In another embodiment, the housing includes a flexible layer.

Another aspect of the invention is directed to a method for determining voltage on a transmission line, the method comprising coupling at least one probe capacitor around the transmission line, coupling a measurement capacitor around the transmission line, measuring a first value related to capacitance of the at least one probe capacitor, determining, based on the act of measuring, a second value related to capacitance of the measurement capacitor, and calculating a third value related to a voltage on the transmission line by utilizing a voltage divider ratio set by the first value and a capacitance value of a reference capacitor.

According to one embodiment, coupling the at least one probe capacitor around the transmission line includes coupling the at least one probe capacitor around the transmission line so that the at least one probe capacitor is isolated from a ground connection of the transmission line. In one embodiment, coupling at least one probe capacitor around the transmission line includes coupling a first and a second probe capacitor around the transmission line in series and wherein measuring the first value related to capacitance of the at least one probe capacitor includes measuring the first value based on characteristics of the first and second probe capacitors.

According to another embodiment, determining, based on the act of measuring, the second value related to capacitance of the measurement capacitor includes doubling the first value to determine the second value related to capacitance of the measurement capacitor. In another embodiment, the method further comprises adjusting the voltage divider ratio by adjusting the capacitance value of the reference capacitor in response to the second value related to capacitance of the measurement capacitor.

One aspect of the invention is directed to a sensor for detecting voltage on a transmission line, the transmission line including an internal conductor layer, the sensor comprising a housing configured to be coupled around a portion of the transmission line, a capacitance probe coupled to the housing and isolated from a ground connection of the transmission line, a voltage measurement system coupled to the housing, and means for measuring a first value related to capacitance of a first capacitance element formed by the internal conductor layer of the transmission line and the capacitance probe, calculating a second value related to capacitance of a second capacitance element formed by the internal conductor layer of the transmission line and the voltage measurement system based on the first value, transmitting the second value to the voltage measurement system, and calculating a third value related to a voltage level of the transmission line based on the second value.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 6A-6D are diagrams of a flexible non-contact and self-calibrating AC voltage sensor with three capacitive elements according to aspects of the current invention; and FIGS. 7A-7D are diagrams of a flexible non-contact and self-calibrating AC voltage sensor with two capacitive elements according to aspects of the current invention.

DETAILED DESCRIPTION

Figure 1:
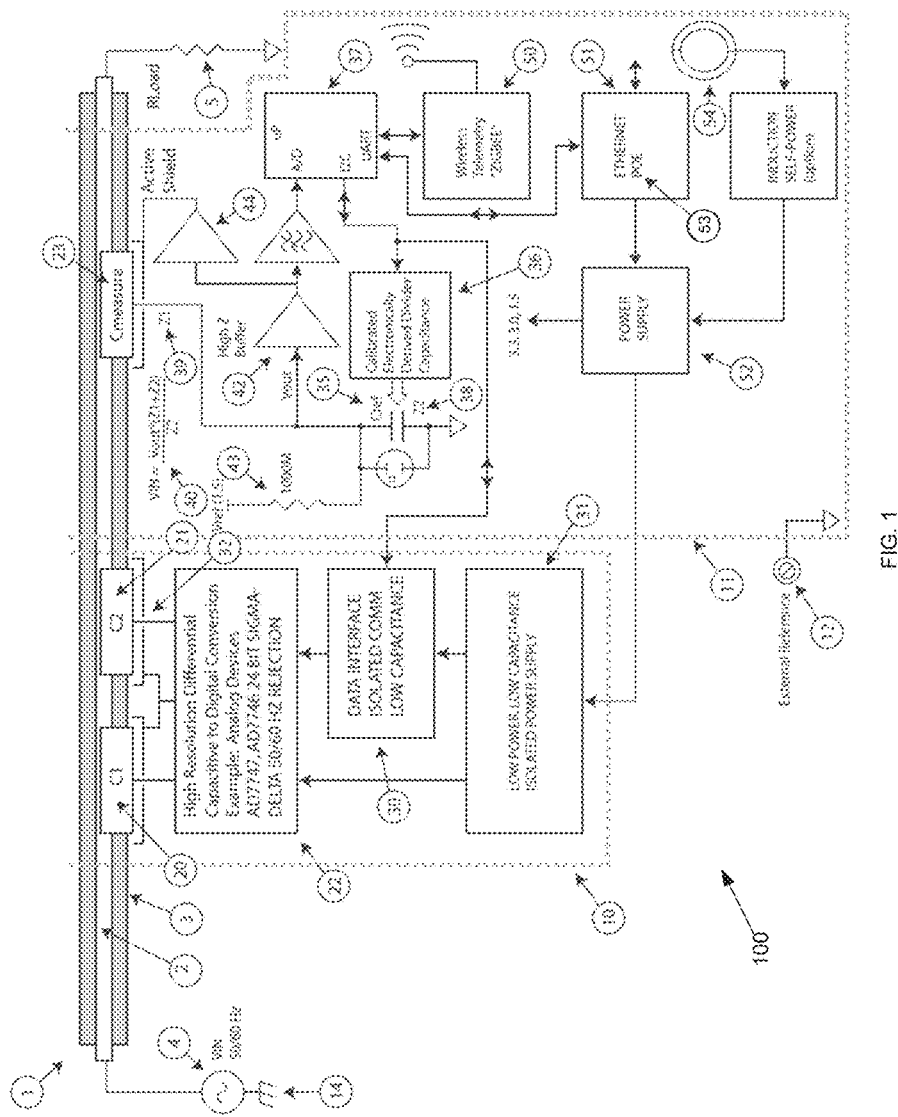
FIG. 1 is a block diagram of one embodiment of a non-contact and self-calibrating AC voltage sensor with three capacitive elements according to aspects of the current invention.

Various embodiments and aspects thereof will now be discussed in detail with reference to the accompanying drawings. It is to be appreciated that this invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, it is oftentimes necessary to monitor the voltage signals of the feeder or branch transmission lines of a power system in order to provide energy and/or power quality measurements. Existing low-cost devices for measuring the voltage of these lines typically require direct electrical connection with the transmission line. This direct connection requires installation and compliance with safety requirements that greatly increase the cost, installation time, and risks involved. Wiring and fusing requirements may further complicate the matter.

Existing non-contact capacitive voltage monitors are often less accurate than desirable due to the instability of capacitances in the transmission lines over varying physical and environmental conditions. For example, such physical and environmental changes may result due to dimensional, clamping proximity, or dielectric changes which are difficult, if not impossible to control. The electrical insulation materials (i.e. dielectric) used by AC power transmission cable manufacturers varies greatly based on design guidelines driven by cost and electrical insulations characteristics. Dielectric stability in a transmission line is generally not a major design consideration and therefore dielectric instability may hinder performance of capacitive voltage sensing techniques At least some embodiments described herein provide an AC voltage sensor capable of measuring transmission line voltage with sufficient accuracy without breaking the insulation barrier of the transmission line. In addition, at least some embodiments of an AC voltage sensor described herein include a real time capacitance auto-calibration capability.

FIG. 1 is a block diagram of one embodiment of a non-contact and self-calibrating AC voltage sensor 100 with three capacitive elements according to aspects described herein. The AC voltage sensor 100 is configured to monitor the AC voltage on an AC power transmission cable 1 having an inner conductor 2 and an insulating dielectric 3. The AC power transmission cable 1 is driven by an AC source 4 (e.g. a Utility supply) (coupled to external system ground 14) and terminated by a load 5. According to one embodiment, the AC power transmission cable 1 is part of a single phase system; however in other embodiments, the AC power transmission cable 1 may be part of a poly-phase system.

The AC voltage sensor 100 includes a self-calibrating probe capacitance acquisition sub-system 10 and an auto-ranging capacitive voltage divider measurement sub-system 11. Utilizing the capacitance acquisition sub-system 10 and the voltage divider measurement sub-system 11, the AC voltage sensor 100 is configured to provide a measurement of voltage on the AC power transmission cable 1 in reference to an external reference at a wired input 12. According to one embodiment, the external reference at the input 12 is connected to the external system ground 14 or a neutral connection to which the voltage measurement is referenced.

The probe capacitance acquisition sub-system 10 includes a first probe capacitor (C1) 20 and a second probe capacitor (C2) 21. The voltage divider measurement sub-system 11 includes a measurement capacitor (Cmeasure) 23. According to one embodiment, Capacitors C1 20, C2 21, and Cmeasure 23 are formed with circular or semi-circular conductive plates mechanically encircling a portion, in both length and circumference, of the transmission cable 1, in such a manner as to form individual and galvanically isolated capacitive elements.

The specific capacitance between the conductive plates and the inner conductor 2 is a function of the physical proximity, shape, cable insulating dielectric 3, inner conductor 2 size, and surface area of the individual probe capacitors C2 20, C2 21 and Cmeasure 23. In one embodiment, the capacitors C1 20, C2, 21, and Cmeasure 23 have capacitances of less than 50 pF between the inner conductor 2 and the individual capacitor conductive plates; however, in other embodiments, the capacitance may vary depending on dielectric and dimensional characteristics of the transmission line being measured.

The conductive plates of capacitors C1 20, C2 21, and Cmeasure 23 may be coupled (i.e. clamped) to the transmission cable 1 (so that the plates encircle the transmission cable 1) through a variety of ways. For example, in one embodiment, the structure of the sensor 100 is of a multi-layer flexible wrap around laminate film having internally embedded conductive plates and shielding. In another embodiment, the structure of the sensor 100 is of a rigid plastic clamping mechanism having internally embedded conductive plates and shielding. The structure of sensor 100 will be discussed in greater detail below.

According to one embodiment, probe capacitors C1 20, C2 21 and Cmeasure 23 are formed to have substantially identical physical topology (area, shape, clamping action etc.) providing close to identical inner conductor 2 to individual conductive plate capacitance. In other words, all three probe capacitors, C1 20, C2 21 and Cmeasure 23 offer identical (within understood tolerances) capacitance values.

The probe capacitance acquisition sub-system 10 also includes a capacitance to digital conversion IC 22. According to one embodiment, the capacitance to digital conversion IC 22 is a high resolution charge accumulating Sigma-Delta (24 bit) precision capacitance to digital conversion IC such as the AD7747 or AD7745 capacitance to digital conversion IC's manufactured by Analog Devices of Norwood, Mass.; however, in other embodiments, other conversion ICs or capacitive measurement techniques may be used.

The probe capacitance acquisition sub-system 10 further includes an isolated data interface 30 coupled between the capacitance to digital conversion IC 22 and the voltage divider measurement sub-system 11, and an isolated power supply 31 coupled to both the isolated data interface 30 and the capacitance to digital conversion IC 22. The isolated power supply 31 is also coupled to the voltage divider measurement sub-system 11. According to one embodiment, the probe capacitance acquisition sub-system 10 additionally includes an actively driven Faraday shield 32 operable to shield the capacitive elements from unwanted external electric fields.

In operation, the probe capacitance acquisition sub-system 10 continuously measures the differential capacitance between probe capacitors C1 20 and C2 21 utilizing the capacitance to digital conversion IC 22. The capacitance to digital conversion IC 22 provides a measurement of the capacitance between probe capacitors C1 20 and C2 21. As probe capacitors C1 20 and C2 21 are essentially connected in a series configuration, the individual capacitance value of each of the probe capacitors C1 20 and C2 21 may be determined by numerically doubling the capacitance between probe capacitors C1 20 and C2 21, measured by the capacitance to digital conversion IC 22. In addition, as all three probe capacitors, C1 20, C2 21 and Cmeasure 23 are configured to offer substantially identical capacitance values, by determining the individual capacitance values of C1 20 and C2 21, the individual capacitance of Cmeasure 23 is also determined. The individual capacitance of Cmeasure 23 is provided to the voltage divider measurement sub-system 11 via the isolated data interface 30.

According to one embodiment, the ability of the probe capacitance acquisition sub-system 10 to provide accurate probe capacitance measurements relies on having the probe capacitance acquisition sub-system 10 galvanically and capacitively isolated from the measurement circuitry (i.e. the voltage divider measurement sub-system 11) and the external system ground 14. This isolation may prevent 50/60 Hz fundamental and other power system noise components from giving rise to unwanted capacitive currents flowing through probe capacitors C1 20 and C2 21 and impacting precision capacitance measurement by the capacitance to digital conversion IC 22.

According to one embodiment, isolation is afforded by the isolated data interface 30 and the isolated power supply 31. In one embodiment the actively driven Faraday shield 32 also provides protection from parasitic external electric field sources. In another embodiment, additional magnetic shielding and minimal circuit conductor loop area may be required where the conductor of the transmission line 1 carries high AC currents to provide a desired level of protection from magnetic field noise induction.

By continuously monitoring capacitive characteristics of the AC power transmission cable 1 over the limited length of the sensor 100 (i.e. the capacitance between probe capacitors C1 20 and C2 21) a self-calibration functionality is afforded to the determination of the capacitance of Cmeasure 23; the value of which allows for an accurate determination of the AC voltage on the transmission cable 1, as described in greater detail below.

The auto-ranging capacitive voltage divider measurement system 11 includes a capacitive voltage divider formed by Cmeasure 23 and a reference capacitor (Cref) 35 coupled to Cmeasure 23. According to one embodiment, Cref 35 is derived from a calibrated, electronically derived reference capacitance circuit 36 (i.e. a capacitor multiplier) which is controlled (e.g., by 256 bit resolution) by a control processor 37 within the voltage divider measurement system 11. In another embodiment, Cref 35 is derived from a bank of capacitors having a number of binary weighted value capacitors that are switched in and out of circuit to derive the calibrated Cref 35 value.

The voltage divider measurement system 11 further includes a high impedance buffer 42 coupled between Cref 35 and the processor 37. The auto-ranging capacitive voltage divider measurement system 11 measures the AC source 4 potential on the transmission line 1 through a capacitive divider formed by Cmeasure 23 and Cref 35.

The control processor 37 receives periodic "real time" Cmeasure 23 probe capacitance value updates from the self-calibrating probe capacitance acquisition sub system 10. The processor 37 utilizes the received Cmeasure 23 probe capacitance to calculated impedance Z1 39.

The control processor 37 also controls the calibrated, electronically derived reference capacitance circuit 36 to define Cref 35. By defining Cref 35, the control processor 37 also defines impedance Z2 38. According to one embodiment, the control processor 37 defines Cref 35 in order to adjust the capacitive voltage divider ratio (between Cmeasure 23 and Cref 35) to a level required for A/D conversion and multi-sample RMS calculation. This also affords a capacitive voltage divider ratio auto-ranging functionality to accommodate a wide range of measurement voltages.

Based on the capacitance Cmeasure 23 received from the probe capacitance acquisition sub system 10 and the capacitance Cref 35 defined by the calibrated, electronically derived reference capacitance circuit 36, the capacitive voltage divider ratio is defined. The divider resultant potential Vout is applied to the high impedance buffer 42 to reduce circuit loading and signal phase shift. The control processor 37 receives the Vout potential from the buffer 42 and uses this calibration data to control the calibrated, electronically derived reference capacitance circuit 36 to define the desired Cref 35 value (and consequently the associated impedance Z2 38 and the voltage divider ratio).

A simple voltage divider calculation 40 is made by the control processor 37 to determine the voltage level on the transmission line 1. For example, VIN (the AC source 4 voltage level on the transmission line 1) may be calculated utilizing the following formula.

$$VIN=(Vout*(Z1+Z2))/Z2 \quad \text{(Equation 1)}$$

According to one embodiment, the control processor 37 may also receive system current measurement signals and utilize the system current measurement signals and the divider resultant potential Vout to calculate power being supplied by the transmission line 1. While making power calculations, the divider resultant potential Vout is automatically calibrated using the probe capacitance acquisition sub-system 10 capacitance calibration values.

According to one embodiment, the auto-ranging capacitive voltage divider measurement system 11 further includes wireless and wired communication options. For example, in one embodiment, the voltage divider measurement system 11 includes a radio transceiver 50 (e.g., such as a Zigbee transceiver 50) or wired Ethernet port 51 for transmitting the measured voltage level to a destination system.

The auto-ranging capacitive voltage divider measurement system 11 further includes a power supply 52 to provide power to components of the voltage divider measurement system 11. According to one embodiment, the power supply 52 is coupled to the isolated power supply 31 of the probe capacitance acquisition sub system 10. Also, according to one embodiment, the power supply 52 may have a variety of source options including Power over Ethernet (POE) 53 via the Ethernet port 51 or isolated line current magnetic induction through a clamp-on Current Transformer (CT) 54.

By automatically self-calibrating the value of Cmeasure 23 and utilizing the value of Cmeasure 23 to define a capacitive voltage divider ratio, the sensor 100 is capable of accurately determining the AC voltage on the transmission cable 1 despite potential varying physical and environmental conditions.

Figure 2:
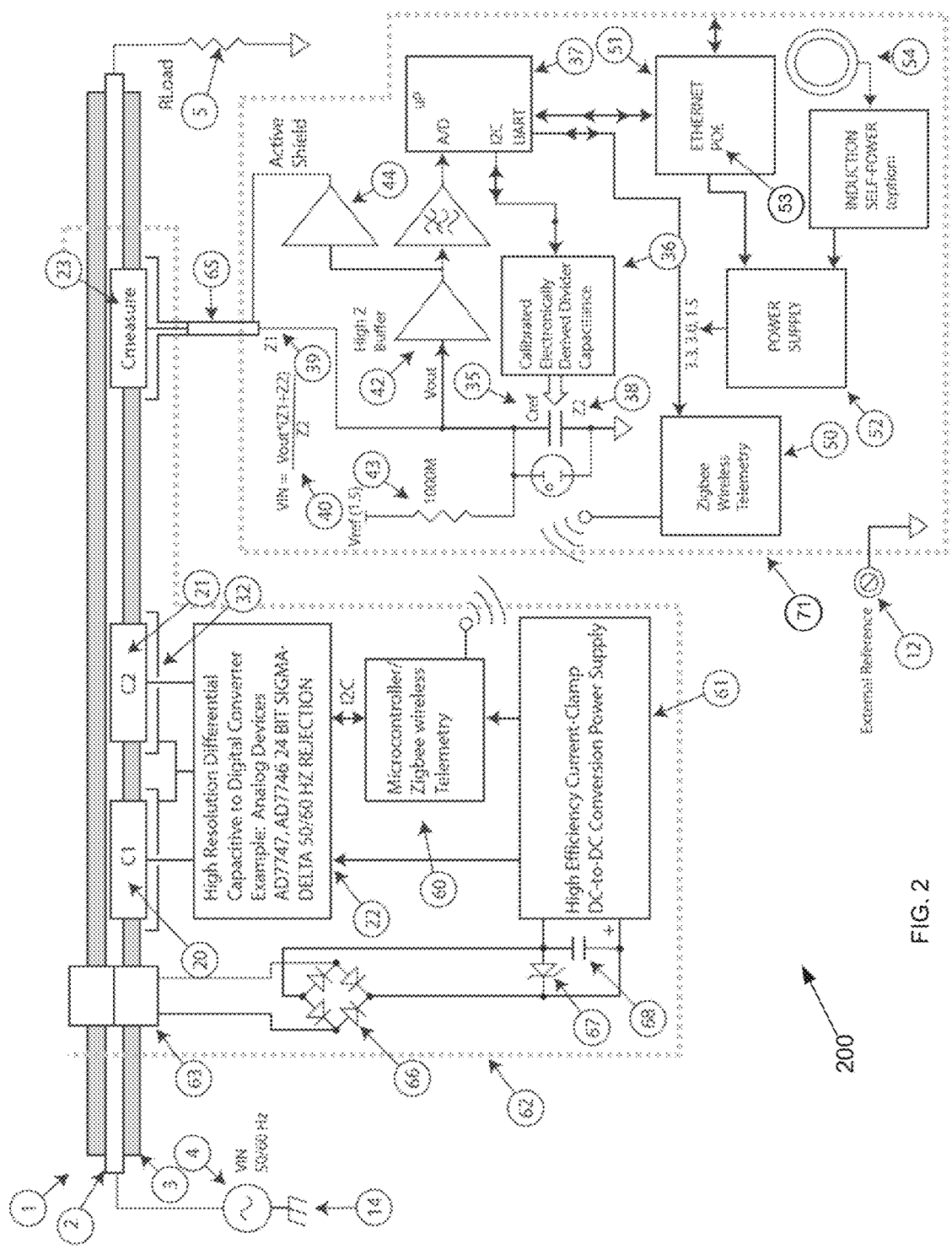
FIG. 2 is a block diagram of another embodiment of a non-contact and self-calibrating AC voltage sensor with three capacitive elements according to aspects of the current invention.

FIG. 2 is a block diagram of another embodiment of a non-contact and self-calibrating AC voltage sensor 200 with three capacitive elements according to aspects described herein. The sensor 200 is similar to the sensor described in relation to FIG. 1 in that it is configured to monitor the AC voltage on the AC power transmission cable 1 having an inner conductor 2 and an insulating dielectric 3. The AC power transmission cable 1 is driven by an AC source 4 (coupled to external system ground 14) and terminated by a load 5. According to one embodiment, the AC power transmission cable 1 is part of a single phase system; however in other embodiments, the AC power transmission cable 1 may be part of a poly-phase system.

The AC voltage sensor 200 includes two functional and galvanically isolated sections; a self-powered and self-calibrating probe capacitance acquisition sub system 62 and an auto-ranging capacitive voltage divider measurement system 71, which are configured to provide a transmission cable 1 AC voltage measurement in reference to the external reference coupled to input 12. According to one embodiment, the external reference is coupled to the external system ground 14 or a neutral connection to which the voltage measurement is referenced.

The probe capacitance acquisition sub-system 62 includes a first probe capacitor (C1) 20 and a second probe capacitor (C2) 21. The voltage divider measurement sub-system 71 includes a measurement capacitor (Cmeasure) 23. According to one embodiment, Capacitors C1 20, C2 21, and Cmeasure 23 are formed with circular or semi-circular conductive plates mechanically encircling a portion, in both length and circumference, of the transmission cable 1, in such a manner as to form individual and galvanically isolated capacitive elements.

The specific capacitance between the conductive plates and the inner conductor 2 is a function of the physical proximity, shape, cable insulating dielectric 3, inner conductor 2 size, and surface area of the individual probe capacitors C2 20, C2 21 and Cmeasure 23. In one embodiment, the capacitors C1 20, C2, 21, and Cmeasure 23 have capacitances of less than 50 pF between the inner conductor 2 and the individual capacitor conductive plates; however, in other embodiments and depending on transmission line characteristics, the capacitance may vary.

The conductive plates of capacitors C1 20, C2 21, and Cmeasure 23 may be coupled (i.e. clamped) to the transmission cable 1 (so that the plates encircle the transmission cable 1) through a variety of ways. For example, in one embodiment, the structure of the sensor 100 is of a multilayer flexible wrap around laminate film having internally embedded conductive plates and shielding. In another embodiment, the structure of the sensor 100 is of a rigid plastic clamping mechanism having internally embedded conductive plates and shielding. The structure of sensor 100 will be discussed in greater detail below.

According to one embodiment, probe capacitors C2 20, C2 21 and Cmeasure 23 are formed to have substantially identical physical topology (area, shape, clamping action etc.) providing close to identical inner conductor 2 to individual conductive plate capacitance. In other words, all three probe capacitors, C1 20, C2 21 and Cmeasure 23 have the same (within understood tolerances) capacitance values.

The probe capacitance acquisition sub-system 62 also includes a capacitance to digital conversion IC 22. According to one embodiment, the capacitance to digital conversion IC 22 is a high resolution charge accumulating Sigma-Delta (24 bit) precision capacitance to digital conversion IC such as an AD7747 or AD7745 capacitance to digital conversion IC manufactured by Analog Devices of Norwood, Mass.; however, in other embodiments, other substantially equivalent capacitance to digital conversion ICs may be used.

The probe capacitance acquisition sub-system 62 further includes a wireless radio telemetry module 60 (e.g., a Zigbee wireless telemetry module 60) coupled to the capacitance to digital conversion IC 22, and a DC-to-DC conversion power supply 61 coupled to the Zigbee wireless telemetry module 60 and the capacitance to digital conversion IC 22. According to one embodiment, the DC-to-DC conversion power supply 61 is further coupled to a full wave bridge rectifier 66 via a voltage clamp zener diode 67. The full wave bridge rectifier 66 is coupled to an inductive current clamp transformer 63 which is placed over the current carrying inner conductor 2. According to one embodiment, the probe capacitance acquisition sub-system 62 additionally includes an actively driven Faraday shield 32.

The probe capacitance acquisition sub-system 62 continuously measures the differential capacitance between probe capacitors C1 20 and C2 21 utilizing the capacitance to digital conversion IC 22. The capacitance to digital conversion IC 22 provides a measurement of the capacitance between probe capacitors C1 20 and C2 21. As probe capacitors C1 20 and C2 21 are essentially connected in a series configuration, the individual capacitance value of each of the probe capacitors C1 20 and C2 21 may be determined by numerically doubling the capacitance between probe capacitors C1 20 and C2 21, measured by the capacitance to digital conversion IC 22. In addition, as all three probe capacitors, C1 20, C2 21 and Cmeasure 23 are configured to offer substantially identical capacitance values, by determining the individual capacitance values of C1 20 and C2 21, the individual capacitance of Cmeasure 23 is also determined. The individual capacitance of Cmeasure 23 is provided wirelessly to the voltage divider measurement sub-system 11 via the Zigbee wireless telemetry module 60.

According to one embodiment, the ability of the probe capacitance acquisition sub-system 62 to provide accurate probe capacitance measurements relies on having the probe capacitance acquisition sub-system 62 galvanically and capacitively isolated from the measurement circuitry (i.e. the voltage divider measurement sub-system 71) and the external system ground 14. This isolation may prevent 50/60 Hz fundamental and other power system noise components from giving rise to unwanted capacitive currents flowing through probe capacitors C1 20 and C2 21 and impacting precision capacitance measurement by the capacitance to digital conversion IC 22.

According to one embodiment, isolation is afforded by the inductive current clamp transformer 63 which is placed over the current carrying inner conductor 2. The inductive current clamp transformer 63 functions to provide isolated DC power to components of the probe capacitance acquisition sub-system 62 via the full wave bridge rectifier 66, the voltage clamp zener diode 67, the energy storage filter capacitor 68 and the DC-to-DC conversion power supply 61. Accordingly, the probe capacitance acquisition sub-system 62 essentially "floats" with no connection to system ground.

In one embodiment the actively driven Faraday shield 32 also provides protection from parasitic external electric field sources. In another embodiment, additional magnetic shielding and minimal circuit conductor loop area may be required where the conductor of the transmission line 1 carries high AC currents in order to provide a desired level of protection from magnetic field noise induction.

By continuously monitoring capacitive characteristics of the AC power transmission cable 1 over the limited length of the sensor 100 (i.e. the capacitance between probe capacitors C1 20 and C2 21) with an isolated probe capacitance acquisition sub-system 62, a self-calibration functionality is afforded to the determination of the capacitance of Cmeasure 23; the value of which allows for an accurate determination of the AC voltage on the transmission cable 1, as described in greater detail below.

The auto-ranging capacitive voltage divider measurement system 71 includes a capacitive voltage divider formed by Cmeasure 23 and a reference capacitor (Cref) 35 coupled to Cmeasure 23. According to one embodiment capacitive voltage divider measurement system 71 includes a coaxial cable connection 65 which provides connection between Cmeasure 23 and the rest of the components of the capacitive voltage divider measurement system 71. In such an embodiment, Cmeasure 23 and the rest of the components of the capacitive voltage divider measurement system 71 may be located at separate locations.

Cref 35 is derived from a calibrated, electronically derived reference capacitance circuit 36 (i.e. a capacitor multiplier) which is controlled (e.g., by 256 bit resolution) by a control processor 37 within the voltage divider measurement system 71. The voltage divider measurement system 71 further includes a high impedance buffer 42 coupled between Cref 35 and the processor 37. The auto-ranging capacitive voltage divider measurement system 71 measures the voltage on the transmission line 1 through a capacitive divider formed by Cmeasure 23 and Cref 35.

The control processor 37 receives periodic "real time" Cmeasure 23 probe capacitance value updates from the self-calibrating probe capacitance acquisition sub system 62. According to one embodiment, the capacitive voltage divider measurement system 71 further includes a wireless radio telemetry module (e.g., a Zigbee wireless telemetry module 50) coupled to the control processor 37 which receives wireless Cmeasure 23 probe capacitance value updates from the Zigbee wireless telemetry module 60 of the probe capacitance acquisition sub system 62. The processor 37 utilizes the received Cmeasure 23 probe capacitance to calculate impedance Z1 39.

The control processor 37 also controls the calibrated, electronically derived reference capacitance circuit 36 to define Cref 35. By defining Cref 35, the control processor 37 also defines impedance Z2 38. According to one embodiment, the control processor 37 defines Cref 35 to adjust the capacitive voltage divider ratio (between Cmeasure 23 and Cref 35) to a level required for A/D conversion and multi-sample RMS calculation. This also affords a capacitive voltage divider ratio auto-ranging functionality to accommodate a wide range of measured voltage levels.

Based on the capacitance Cmeasure 23 received from the probe capacitance acquisition sub system 62 and the capacitance Cref 35 defined by the calibrated, electronically derived reference capacitance circuit 36, the capacitive voltage divider ratio is defined. The divider resultant potential Vout is applied to the high impedance buffer 42 to reduce circuit loading and signal phase shift. The control processor 37 receives the Vout potential from the buffer 42 and uses this calibration data to control the calibrated, electronically derived reference capacitance circuit 36 to define the desired Cref 35 value (and consequently the associated impedance Z2 38 and the voltage divider ratio).

A simple voltage divider calculation 40 is made by the control processor 37 to determine the AC source 4 voltage level on the transmission line 1. For example, VIN (the AC source 4 voltage level on the transmission line 1) may be calculated using Equation (1) provided above.

According to one embodiment, the auto-ranging capacitive voltage divider measurement system 71 further includes wireless and wired communication options. For example, in one embodiment, the Zigbee transceiver 50 or wired Ethernet port 51 may be configured to transmit the calculated voltage level to a destination system.

The auto-ranging capacitive voltage divider measurement system 71 further includes a power supply 52 to provide power to components of the voltage divider measurement system 71. According to one embodiment, the power supply 52 may have a variety of source options including Power over Ethernet (POE) 53 via the Ethernet port 51 or isolated line current magnetic induction through a clamp-on Current Transformer (CT) 54.

By automatically self-calibrating the value of Cmeasure 23 with an isolated sensor portion and utilizing the value of Cmeasure 23 to define a capacitive voltage divider ratio, the sensor 100 is capable of accurately determining the AC voltage on the transmission cable 1, despite potential varying physical and environmental conditions.

Figure 3:
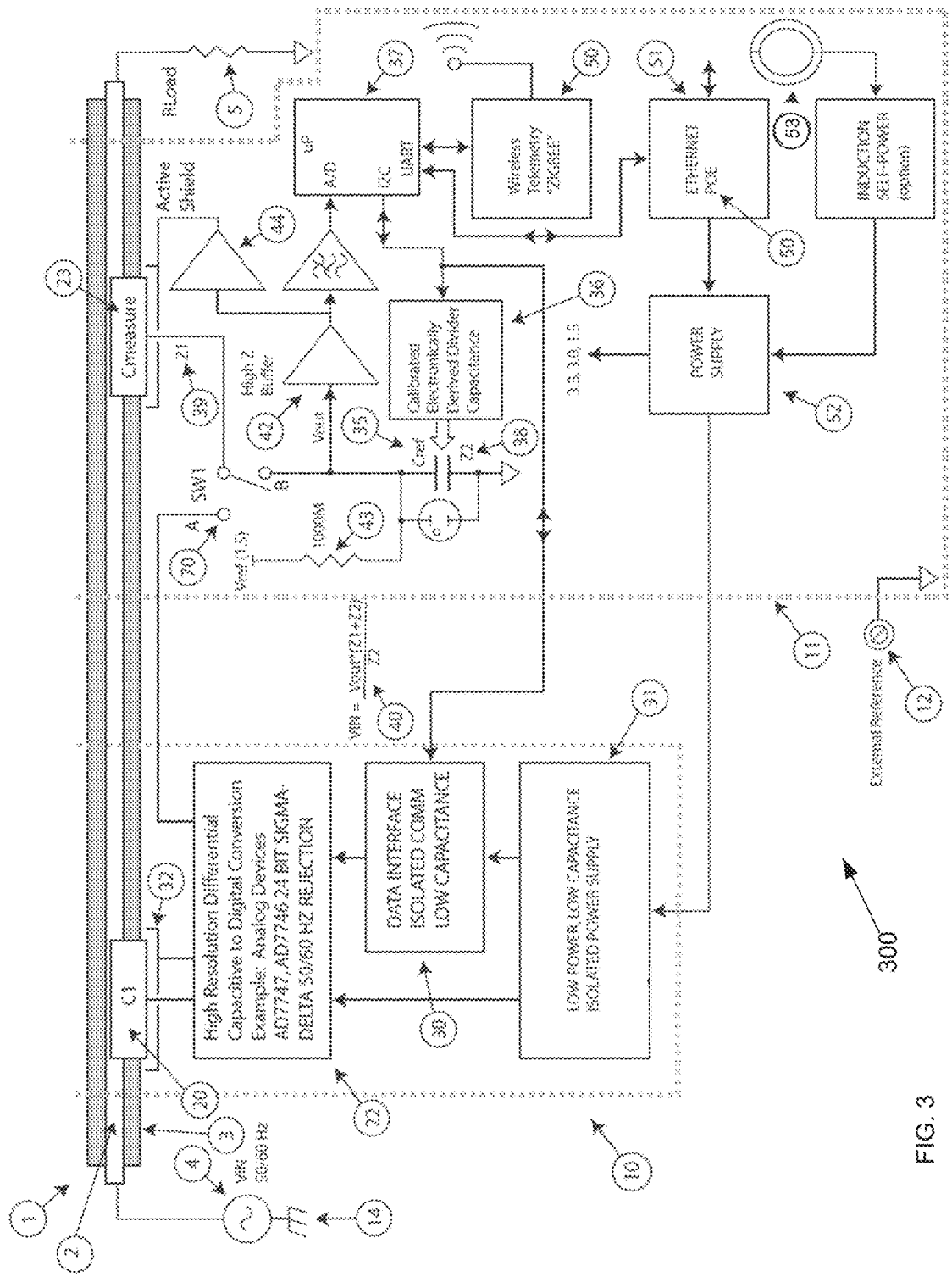
FIG. 3 is a block diagram of one embodiment of a non-contact and self-calibrating AC voltage sensor.

FIG. 3 is a block diagram of one embodiment of a non-contact and self-calibrating AC voltage sensor 300 with two capacitive elements according to aspects described herein. Sensor 300 is substantially the same as sensor 100 described in relation to FIG. 1, except that in sensor 300, probe capacitor C2 21 is eliminated and switch SW1 70 is added. Switch SW1 70 is configured, in a first mode of operation, to selectively couple the capacitance to digital conversion IC 22 to Cmeasure 23, and in a second mode of operation, to selectively couple Cmeasure 23 to Cref 22. Switch SW1 70 is operated by the control processor 37.

As probe capacitor C2 21 is not present in sensor 300, capacitor Cmeasure 23 is utilized as both a probe capacitor (i.e. a capacitor similar to C2 21) and as a measurement capacitor. When it is desired for the probe acquisition sub system 10 to determine the capacitance of Cmeasure 23 by monitoring the capacitance between two probe capacitors in series, the switch SW1 70 is operated in the first mode of operation, and the capacitance to digital conversion IC 22 measures the differential capacitance between capacitors C1 20 and Cmeasure 23.

As similarly described above, the capacitance to digital conversion IC 22 provides a measurement of the differential capacitance between capacitors C1 20 and Cmeasure 23. As capacitors C1 20 and Cmeasure 23 are essentially connected in a series configuration and are configured to offer substantially identical capacitance values, the individual capacitance value of Cmeasure 23 may be determined by numerically doubling the capacitance between probe capacitors C1 20 and Cmeasure 23, measured by the capacitance to digital conversion IC 22. The calculated individual capacitance value of Cmeasure 23 is provided to the capacitive voltage divider measurement system 11 by the probe acquisition sub system 10.

When it is desired for the voltage divider measurement system 11 to calculate the AC source 4 voltage on the transmission line 1, the switch SW1 70 is operated in the second mode of operation to couple Cmeasure 23 to Cref 38 (i.e. to complete the capacitive voltage divider). The impedance Z1 is calculated by the control processor 37 with regards to the received value of Cmeasure 23 and the capacitance Cref 35 (and consequently the impedance Z2 and the voltage divider ratio) is controlled by the control processor 37 as described above. Based on these calculations the AC source 4 voltage on the transmission line 1 is determined by a simple voltage divider calculation, as described above.

The configuration of FIG. 3 reduces the number of capacitive elements (e.g., from three to two) within the sensor and includes the actual capacitance of Cmeasure 23 in the measurement equation which may improve accuracy.

As described above, the conductive plates of capacitors C1 20, C2 21, and Cmeasure 23 may be coupled (i.e. clamped) to the transmission cable 1 (so that the plates encircle the transmission cable 1) through a variety of ways.

Figure 4:
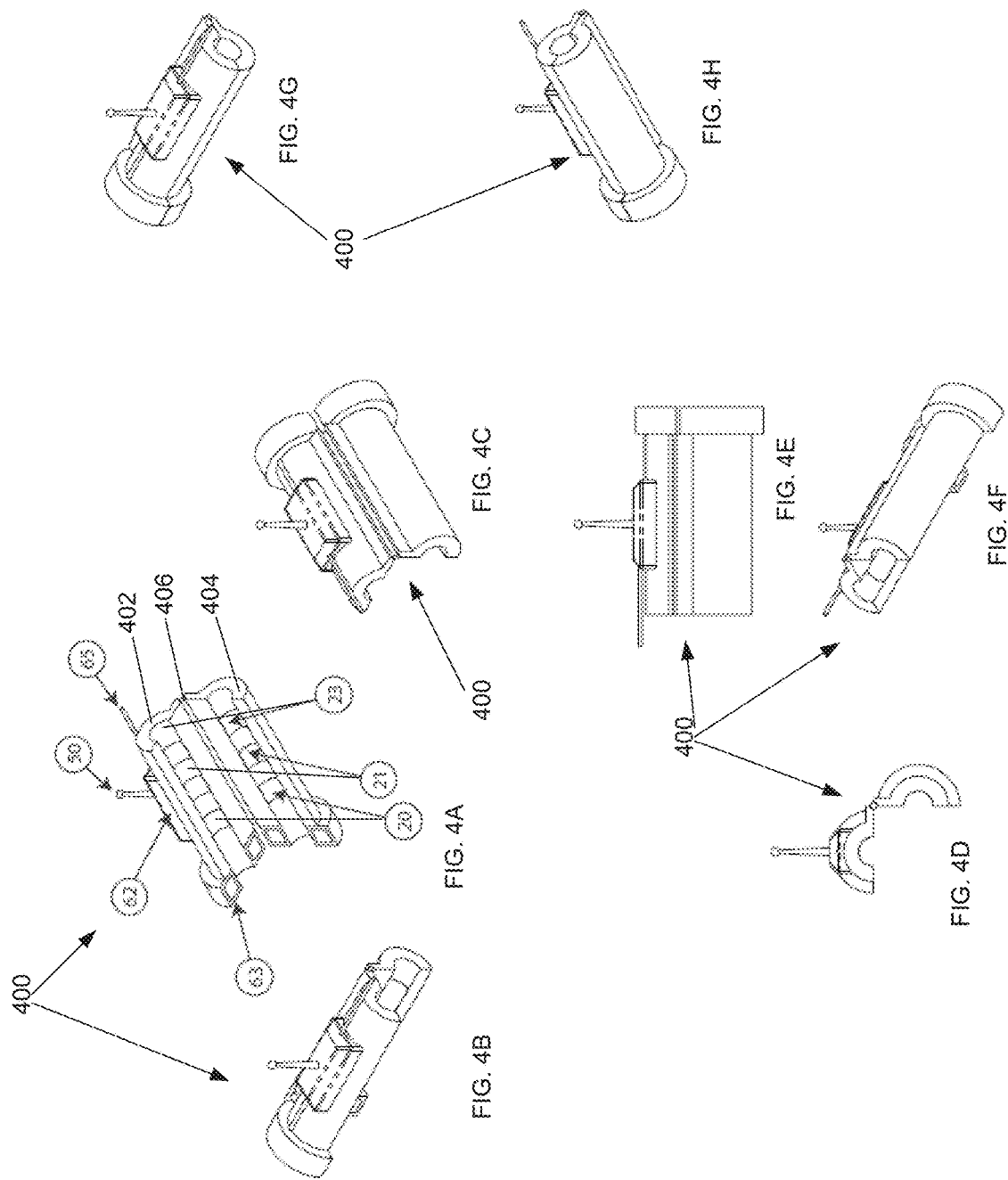
FIGS. 4A-4H are diagrams of a rigid non-contact and self-calibrating AC voltage sensor with three capacitive elements according to aspects of the current invention.

FIG. 4A is a diagram of a rigid non-contact and self-calibrating AC voltage sensor 400 with three capacitive elements according to aspects described herein. The sensor 400 includes a first portion 402 and a second portion 404 coupled together via a hinge 406. Both the first portion 402 and the second portion 404 include probe capacitor C1 20, probe capacitor C2 21 and measurement capacitor Cmeasure 23.

According to one embodiment, the first portion 402 also includes the self-powered and self-calibrating probe capacitance acquisition sub-system 62, as described above with reference to FIG. 2. In one embodiment, the probe capacitance acquisition sub-system 62 includes an inductive current clamp transformer 63 which provides power to the probe capacitance acquisition sub-system 62, a Zigbee wireless transceiver 50, and a coaxial cable 65. As described above, the coaxial cable 65 is configured to be coupled between Cmeasure 23 and an auto-ranging capacitive voltage divider measurement system 71 at another location.

To couple the sensor 400 to a transmission cable 1, the transmission cable 1 is placed between the first portion 402 and the second portion 404. The first portion 402 and the second portion 404 are pushed together so that the transmission cable 1 is enclosed by the first portion 402 and second portion 404 and so that the Capacitors C1 20, C2 21 and Cmeasure 23 encircle a portion of the transmission cable 1.

Based on the capacitance between C1 20 and C2 21, the probe capacitance acquisition sub-system 62 calculates the individual capacitance of C1 20, C2, 21 and Cmeasure 23, as described above. The individual capacitance of Cmeasure 23 is transmitted to a voltage divider measurement system 71 via the wireless transceiver 50. The voltage divider measurement system 71 calculates the voltage on the transmission line by utilizing a voltage divider including a reference capacitance (e.g., Cref 35 as seen in FIG. 2) and Cmeasure 23 (coupled to the voltage divider measurement system 71 via a coaxial cable 65).

FIGS. 4A-4F illustrate views of the sensor 400 in an open condition as it would be placed around a transmission cable 1. FIGS. 4G and 4H illustrate views of the sensor 40 in a closed condition as it would be clamped around a transmission cable 1.

Figure 5:
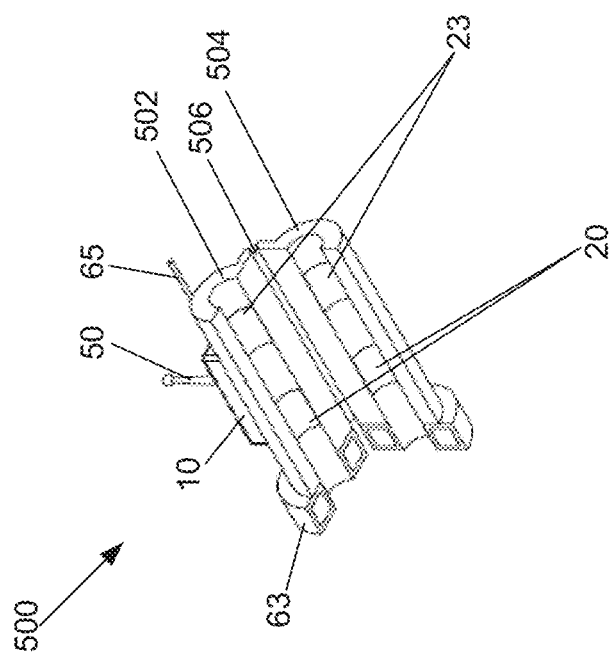
FIG. 5 is a diagram of a rigid non-contact and self-calibrating AC voltage sensor with two capacitive elements according to aspects of the current invention.

FIG. 5 is a diagram of a rigid non-contact and self-calibrating AC voltage sensor 500 with two capacitive elements according to aspects described herein. Sensor 500 is the same as sensor 400 (as described above with regards to FIG. 4) except that sensor 500 does not include probe capacitance C2 21 and hence includes two capacitive elements rather than three. The sensor 500 also includes a first portion 502 and a second portion 504 coupled together via a hinge 506. Both the first portion 502 and the second portion 504 include probe capacitor C1 20 and measurement capacitor Cmeasure 23.

According to one embodiment, the first portion 502 also includes the self-powered and self-calibrating probe capacitance acquisition sub-system 10, as described above with reference to FIG. 3. In one embodiment, as seen with reference to FIG. 2, the probe capacitance acquisition sub-system 10 also includes an inductive current clamp transformer 63 which provides power to the probe capacitance acquisition sub-system 10, a Zigbee wireless transceiver 50, and a coaxial cable 65. As described above, the coaxial cable 65 is configured to be coupled between Cmeasure 23 and an auto-ranging capacitive voltage divider measurement system 71 at another location.

To couple the sensor 500 to a transmission cable 1, the transmission cable 1 is placed between the first portion 502 and the second portion 504. The first portion 502 and the second portion 504 are pushed together so that the transmission cable 1 is enclosed by the first portion 502 and second portion 404 and so that the Capacitors C1 20 and Cmeasure 23 encircle a portion of the transmission cable 1.

Based on the capacitance between C1 20 and Cmeasure 23, the probe capacitance acquisition sub-system 62 calculates the individual capacitance of C1 20 and Cmeasure 23, as described above. The individual capacitance of Cmeasure 23 is transmitted to a voltage divider measurement system 71 via the wireless transceiver 50. The voltage divider measurement system 71 calculates the voltage on the transmission line by utilizing a voltage divider including a reference capacitance (e.g., Cref 35 as seen in FIG. 2) and Cmeasure 23 (coupled to the voltage divider measurement system 71 via a coaxial cable 65).

FIG. 6A is a diagram of a flexible non-contact and self-calibrating AC voltage sensor 600 with three capacitive elements according to aspects described herein. The sensor 600 includes a flexible laminate layer 70 which includes probe capacitors C1 20 and C2 21, and a measurement capacitor Cmeasure 23. According to one embodiment, the sensor 600 also includes insulation (i.e. dielectric) material over each capacitive element. In one embodiment, the sensor 600 may also include a coaxial cable 65 coupled between Cmeasure 23 and an external voltage divider measurement system 71.

The sensor 600 also includes a probe capacitance acquisition sub-system 62 (as shown in FIG. 2) which, while not shown in FIG. 6A, is coupled to the capacitors C1 20 and C2 21 and may be affixed to a portion of the laminate layer 70. In another embodiment, the probe capacitance acquisition sub-system 62 may be mounted elsewhere on a transmission line or at some short distance from the sensor 600.

As seen in FIG. 6C, to couple the sensor 600 to a transmission cable 1, the sensor 600 is placed adjacent the transmission cable 1. The sensor 600 is wrapped around the insulating dielectric 3 of the transmission cable 1 so that the transmission cable 1 is enclosed by the sensor 600 and so that the Capacitors C1 20, C2 21 and Cmeasure 23 encircle a portion of the transmission cable 1. According to one embodiment, an adhesive strip 71 holds the sensor 600 in place around the transmission cable 1. FIG. 6B illustrates the sensor 600 in a wrapped condition and FIG. 6D illustrates the sensor 600 wrapped around the transmission line 1.

Based on the capacitance between C1 20 and C2 21, the probe capacitance acquisition sub-system 62 calculates the individual capacitance of C1 20, C2, 21 and Cmeasure 23, as described above. The individual capacitance of Cmeasure 23 is transmitted to a remote voltage divider measurement system 71 via a wireless transceiver 50 or via a hard wired connection. The voltage divider measurement system 71 calculates the voltage on the transmission line by utilizing a voltage divider including a reference capacitance (e.g., Cref 35 as seen in FIG. 2) and Cmeasure 23 (coupled to the voltage divider measurement system 71 via a coaxial cable 65).

FIG. 7A is a diagram of a flexible non-contact and self-calibrating AC voltage sensor 700 with two capacitive elements according to aspects described herein. The sensor 700 includes a flexible laminate layer 70 which includes probe capacitors C1 20 and measurement capacitor Cmeasure 23. According to one embodiment, the sensor 700 also includes insulation (i.e. dielectric) material over each capacitive element. In one embodiment, the sensor 700 may also include a coaxial cable 65 coupled between Cmeasure 23 and an external voltage divider measurement system 71.

The sensor 700 also includes a probe capacitance acquisition sub-system 62 (as shown in FIG. 2) which, while not shown in FIG. 7A, is coupled to the capacitors C1 20 and Cmeasure 23 (as described above) and may be affixed to a portion of the laminate layer 70. In another embodiment, the probe capacitance acquisition sub-system 62 may be mounted elsewhere on a transmission line or at some short distance from the sensor 700.

As seen in FIG. 7C, to couple the sensor 700 to a transmission cable 1, the sensor 700 is placed adjacent the transmission cable 1. The sensor 700 is wrapped around the insulating dielectric 3 of the transmission cable 1 so that the transmission cable 1 is enclosed by the sensor 700 and so that the Capacitors C1 20 and Cmeasure 23 encircle a portion of the transmission cable 1. According to one embodiment, an adhesive strip 71 holds the sensor 700 in place around the transmission cable 1. FIG. 7B illustrates the sensor 700 in a wrapped condition. FIG. 7D illustrates the sensor 700 wrapped around the transmission cable 1.

Based on the capacitance between C1 20 and Cmeasure 23, the probe capacitance acquisition sub-system 62 calculates the individual capacitance of C1 20 and Cmeasure 23, as described above. The individual capacitance of Cmeasure 23 is transmitted to a remote voltage divider measurement system 71 via a wireless transceiver 50 or via a hard wired connection. The voltage divider measurement system 71 calculates the voltage on the transmission line by utilizing a voltage divider including a reference capacitance (e.g., Cref 35 as seen in FIG. 2) and Cmeasure 23 (coupled to the voltage divider measurement system 71 via a coaxial cable 65).

As described herein, capacitive elements C1, C2 and Cmeasure are nearly identical; however, in other embodiments, non-identical capacitive elements may be utilized. In such a situation, the geometric and resulting electrical relationships of the individual capacitive elements are accounted for in both the calibration (i.e. acquisition) and voltage measurement sub-systems. For example, in one embodiment, where probe capacitance C1 is much larger than probe capacitance C2, the series measurement of the capacitance of C1 (large) and C2 (small) results in the measurement of C2. As C1 is large it appears as a low impedance compared to C2, and therefore C2 dominates the measurement. Once C2 is determined, Cmeasure can be determined as long as the relationships between capacitors are known.

According to another embodiment, to preserve the isolated nature of the measurement system, the external reference 12 may be connected to a non-grounded source (e.g., such as a delta connected system). However, in such an embodiment, the sensor circuit voltage supply and communication components may need to provide necessary electrical isolation.

As described herein, a transmission line of a single phase power system is discussed; however, in other embodiments, a poly-phase system having a plurality of sensors may be utilized.

As described herein, the monitoring of a feeder or branch transmission line is discussed; however, in other embodiments, the sensor circuit may be configured to monitor the voltage of any voltage line.

Therefore, embodiments described herein provide an AC voltage sensor capable of acquiring the transmission line voltage signals with sufficient accuracy without breaking the insulation barrier of the transmission line. By continuously monitoring capacitive characteristics of the AC power transmission cable over the limited length of the sensor, an automatic self-calibration functionality is afforded to the determination of the capacitance of Cmeasure; the value of which allows for an accurate determination of the AC voltage on the transmission cable 1 despite potential varying physical and environmental conditions.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A sensor for detecting voltage on a transmission line, the sensor comprising:
   a housing configured to mechanically encircle, and extend lengthwise along, a portion of the transmission line;
   at least one probe conductive plate coupled to the housing and configured to encircle the portion of the transmission line encircled by the housing, the at least one probe conductive plate further configured to form at least one probe capacitor with the portion of the transmission line;
   a measurement conductive plate coupled to the housing and configured to encircle the portion of the transmission line encircled by the housing, the measurement conductive plate further configured to form a measurement capacitor with the portion of the transmission line;
   a capacitance acquisition system coupled to the at least one probe capacitor; and
   a voltage measurement system coupled to the measurement capacitor and configured to communicate with the capacitance acquisition system,
      wherein the capacitance acquisition system is configured to determine a first value related to capacitance of the at least one probe capacitor, and based on the first value, determine a capacitance value of the measurement capacitor; and
      wherein the voltage measurement system is configured to receive a signal providing the capacitance value of the measurement capacitor from the capacitance acquisition system and calculate a second value related to a voltage level of the transmission line.

2. The sensor of claim 1, wherein the voltage measurement system comprises a voltage divider including the measurement capacitor and a reference capacitor coupled to a ground connection, and wherein the voltage measurement system is configured to calculate the second value related to the voltage level of the transmission line using a voltage divider ratio based on the capacitance value of the measurement capacitor and a capacitance of the reference capacitor.

3. The sensor of claim 2, wherein the capacitance acquisition system is configured to be isolated from a ground connection of the transmission line.

4. The sensor of claim 2, wherein the reference capacitor is a variable reference capacitor and wherein the voltage measurement system further comprises a controller coupled to the voltage divider and to the variable reference capacitor, wherein the controller is configured to define the voltage divider ratio by adjusting the capacitance of the reference capacitor.

5. The sensor of claim 4, wherein the capacitance acquisition system includes a capacitance to digital conversion circuit coupled to the at least one probe capacitor and configured to determine the first value.

6. The sensor of claim 5, wherein the capacitance acquisition system includes a data interface coupled between the capacitance to digital conversion circuit and the controller, and wherein the data interface is configured to transmit the capacitance value of the measurement capacitor to the controller.

7. The sensor of claim 5, wherein the capacitance acquisition system includes a first wireless transceiver coupled to the capacitance to digital conversion circuit, wherein the voltage measurement system includes a second wireless transceiver coupled to the controller, and wherein the first wireless transceiver is configured to transmit the signal to the controller via the second wireless transceiver.

8. The sensor of claim 2, wherein the at least one probe capacitor includes a first probe capacitor and a second probe capacitor, the first and second probe capacitors configured to be coupled around the transmission line in series, and wherein the capacitance acquisition system is configured to determine the first value based on characteristics of the first and second probe capacitors.

9. The sensor of claim 2, wherein the measurement system further comprises a switch configured to selectively couple the capacitance acquisition system to the measurement capacitor in a first mode of operation and to selectively couple the reference capacitor to the measurement capacitor in a second mode of operation,
   wherein the at least one probe capacitor includes a single probe capacitor and the measurement capacitor, the single probe capacitor and the measurement capacitor configured to be coupled around the transmission line in series in the first mode of operation,
   wherein the capacitance acquisition system is configured to determine the first value based on characteristics of the single probe capacitor and the measurement capacitor in the first mode of operation; and
   wherein the voltage measurement system is configured to receive the signal providing the capacitance value of the measurement capacitor from the capacitance acquisition system and calculate, in the second mode of operation, the second value related to the voltage level of the transmission line.

10. The sensor of claim 1, wherein the capacitance acquisition system includes an electrically- and galvanically-isolated power supply configured to provide power to the capacitance acquisition system.

11. The sensor of claim 10, wherein the isolated power supply includes an inductive current clamp transformer configured to be coupled around the transmission line and to provide power to the capacitance acquisition system.

12. The sensor of claim 1, wherein the voltage measurement system includes a wireless transceiver configured to transmit the second value related to the voltage level of the transmission line to an external system.

13. The sensor of claim 1, wherein the at least one probe capacitor and the measurement capacitor have substantially the same capacitance.

14. The sensor of claim 1, wherein the housing includes a flexible layer.

15. A method for determining voltage on a transmission line, the method comprising:
    coupling at least one probe conductive plate around the transmission line to form at least one probe capacitor with the transmission line;
    coupling a measurement conductive plate around the transmission line to form a measurement capacitor with the transmission line;
    measuring a first value related to capacitance of the at least one probe capacitor;
    determining, based on the act of measuring, a capacitance value of the measurement capacitor; and
    calculating a second value related to a voltage on the transmission line by utilizing a voltage divider ratio set by the capacitance value of the measurement capacitor and a capacitance value of a reference capacitor.

16. The method of claim 15, wherein coupling the at least one probe capacitor around the transmission line includes coupling the at least one probe capacitor around the transmission line so that the at least one probe capacitor is isolated from a ground connection of the transmission line.

17. The method of claim 15, wherein coupling the at least one probe capacitor around the transmission line includes coupling a first and a second probe capacitor around the transmission line in series and wherein measuring the first value related to capacitance of the at least one probe capacitor includes measuring the first value based on characteristics of the first and second probe capacitors.

18. The method of claim 17, wherein determining, based on the act of measuring, the capacitance value of the measurement capacitor includes doubling the first value to determine the capacitance value of the measurement capacitor.

19. The method of claim 15, further comprising adjusting the voltage divider ratio by adjusting the capacitance value of the reference capacitor in response to the capacitance value of the measurement capacitor.

20. A sensor for detecting voltage on a transmission line, the transmission line including an internal conductor layer, the sensor comprising:
    a housing configured to mechanically encircle, and extend lengthwise along, a portion of the transmission line;
    a capacitance probe conductive plate coupled to the housing and isolated from a ground connection of the transmission line, the capacitance probe conductive plate configured to form at least one probe capacitor with the portion of the transmission line;
    a voltage measurement system coupled to the housing; and
    means for measuring a first value related to capacitance of the at least one probe capacitor formed by the internal conductor layer of the transmission line and the capacitance probe conductive plate, calculating a capacitance value of a second capacitance element formed with the internal conductor layer of the transmission line and the voltage measurement system based on the first value, transmitting the second value to the voltage measurement system, and calculating a third value related to a voltage level of the transmission line based on the second value.

* * * * *